United States Patent
Gaudet (10) Patent No.: US 6,285,726 B1
(45) Date of Patent: Sep. 4, 2001

(54) 10/100 MB CLOCK RECOVERY ARCHITECTURE FOR SWITCHES, REPEATERS AND MULTI-PHYSICAL LAYER PORTS

(75) Inventor: Brian Gaudet, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/080,740

(22) Filed: May 18, 1998

(51) Int. Cl.[7] .............................. H03D 3/24; H03L 7/00; H03L 7/06; H04L 7/00
(52) U.S. Cl. .................... 375/376; 375/354; 375/373; 327/156; 327/163
(58) Field of Search ....................... 375/327, 354, 375/355, 371, 373, 376, 361; 713/400, 401, 500, 501, 503, 600; 327/146, 147, 148, 149, 150, 152, 155, 159, 156, 157, 158, 163

(56) References Cited

U.S. PATENT DOCUMENTS

| 5,018,169 | 5/1991 | Wong et al. | ............... 375/119 |
| 5,341,405 | * 8/1994 | Mallard, Jr. | ............... 375/376 |

OTHER PUBLICATIONS

John George Maneatis, "Precise Delay Gneration Using Coupled Oscillators", UMI Dissertation Services, Jun. 1994.
J. Christiansen, CERN, Geneva, "An Integrated High Resolution CMOS Timing Generator Based on an Array of Delay Locked Loops".
Mel Bazes, Roni Ashuri and Ernest Knoll, "An Interpolating Clock Synthesizer", IEEE Journal of Solid State Circuits, vol. 31, No. 9, Sep. 1996, pp. 1295–1301.

* cited by examiner

Primary Examiner—Stephen Chin
Assistant Examiner—Betsy L. Deppe
(74) Attorney, Agent, or Firm—Stallman & Pollock LLP (57) ABSTRACT

A clock recovery architecture for recovering clock and serial data from an incoming data stream of a local area network station. A phase picker architecture augmented by a phase interpolator is used as part of the clock recovery architecture to enhance phase resolution. A single clock generation module (CGM) and N phase multiplexers, one for each clock recovery channel on a chip, is used to select one of M phases of a 250 Mhz clock signal from the CGM for each clock recovery channel. To provide the required phase resolution, a phase interpolator is used. The phase interpolator is used to create a number of delay steps evenly spaced between the gross phase steps of the phase multiplexer. Each phase multiplexer is advanced or retarded in response to the pump-up (pumpup) or pump-down (pumpdn) signals from each clock recovery channel (CRM).

11 Claims, 4 Drawing Sheets

Vout / Vin = (sCR2 + 1) / sCR1 pole at zero (ideal integrator)
zero at 1/ (CR2)

atten_p = R1 / R2    (attenuation of proportional control)
atten i = CR1    (attenuation of phase error affecting integrator level)

integrator_depth = C

10/100 MB CLOCK RECOVERY ARCHITECTURE FOR SWITCHES, REPEATERS AND MULTI-PHYSICAL LAYER PORTS

TECHNICAL FIELD

The present invention is directed to local area networks, and more specifically, to a clock recovery architecture that is based upon DLL calibrated phase interpolators that can be used for both 10 mb and 100 mb data streams. The use of a common clock recovery architecture for both data rates provides savings in both power consumption and area over recovery architectures that utilize separate clock recovery channels.

BACKGROUND OF THE INVENTION

A Local Area Network (LAN) utilizes a clock recovery scheme to extract a clock signal from the data transmitted between stations over the network. The recovered clock signal is then used to synchronize the operations performed on the incoming data, e.g., sampling and decoding of the data.

Figure 1:
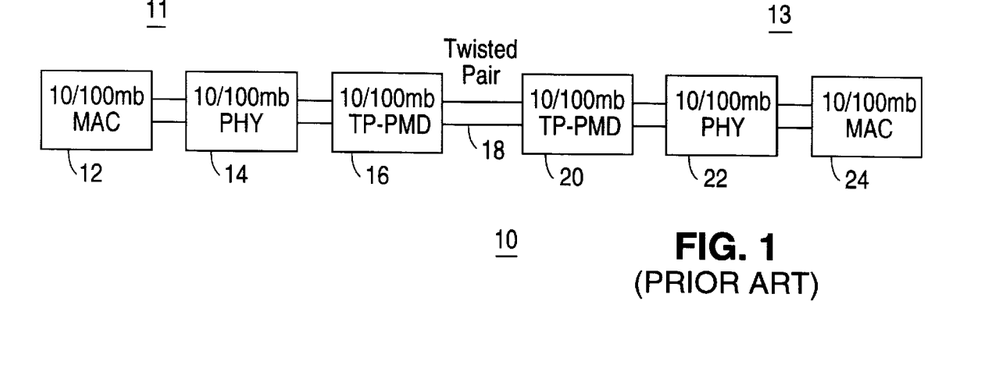
FIG. 1 is a block diagram illustrating the primary functional components of the transmitting station and receiving station of a LAN which are involved in the clock recovery function during the transmission and reception of data.

FIG. 1 shows the primary functional components of a transmitting station 11 and a receiving station 13 of a LAN 10 that are involved in the clock recovery function during the transmission and reception of data. As shown in FIG. 1, the MAC (media access control) layer 12 of the transmitting station (or node) 11 provides data to the PHY (physical) layer 14. The PHY layer 14 encodes the data using a conventional 4B/5B protocol, serializes it, and then scrambles the data stream.

While the 4B/5B encoding insures at least one transition per 5 bits, the scrambling of the data stream reduces the transition density such that there may be as many as 60 consecutive ones or zeros. The phase locked loop (PLL) used to control the sampling of the data must, therefore, be able to keep tracking the frequency difference between the transmitting station 11 and the receiving stations 13 (which is used to control the adaptation of the voltage controlled oscillator which is part of the loop) in the absence of transitions on the incoming data stream. Therefore, a 2nd order loop transfer function for a voltage controlled oscillator (VCO) or frequency controlled oscillator (FCO) type loop (phase error, frequency adjust) is required, or a 1st order loop transfer function for a phase error/phase adjust control system.

With reference to FIG. 1, the scrambled data is passed to TP-PMD 16 at 125 mb/sec. twisted-pair, physical medium dependent (TP-PMD) 16 then encodes the data using MLT3 encoding and drives the twisted pair 18 which forms the transmission medium for the data. MLT3 encoding takes the binary coded message and drives the cable using three output levels in such a way that the power spectral density contains less energy at high frequencies.

At the receive end of twisted pair 18, the TP-PMD 20 of the receiving station 13 does adaptive equalization of the incoming data stream (to minimize the effects of the channel on the signal), MLT3 decoding, and passes the binary 125 mb/sec signal to the receiver PHY layer 22. The receive side of PHY layer 22 must recover a 125 Mhz clock from this data stream, use this clock to sample the data, unscramble the data, convert 4B/5B to nibble wide data, and provide a nibble wide data stream with a 25 Mhz clock to the MAC layer 24 of receiving station 13.

Typically, the stations (or nodes) of such a network will have TP-PMDs and PHYs that can operate at data rates of both 10 Mhz and 100 Mhz. Prior art solutions have used a separate clock recovery channel for each of the 10 and 100 Mhz data rates. This necessitates some duplication of the architecture in both a functional and a structural sense, with the result that excessive surface area and power are consumed.

The data presented by TP-PMD 20 has 1.3 ns p-p DCD (duty cycle distortion) jitter, 2.0 ns peak to peak DDJ (data dependent) jitter, and 2.7 ns p-p gaussian jitter. This leaves a 2 ns jitter-free segment out of an 8 ns window. The clock recovery circuit must be able to ignore the jitter and track only the frequency difference between the transmitting station 11 and the receiving station 13. By adapting the tracking behavior of the clock recovery circuit to the phase difference between the signals, the frequency at which the receiving station 13 samples the transmitted signal can be synchronized to the frequency and phase at which the signal was originally transmitted. The maximum frequency difference between the stations is 100 ppm, so a narrow band phase-locked-loop (PLL) suffices. As noted, the PLL must also be able to keep tracking this frequency difference in the absence of transitions on the incoming data stream, which may contain as many as 60 consecutive ones or zeros. The 10BT jitter specification requires recovering clock and data from a data stream with 36 ns p-p fixed jitter, 36 ns p-p random jitter, or any combination of fixed and random jitter adding up to 36 ns p-p (The 10 mb p-p jitter window is 50 ns; therefore, the jitter is taking 36 ns out of this 50 ns, leaving a 14 ns eye.).

A typical mixed signal (dual channel) approach to clock recovery uses a digital three state frequency/phase detector, a charge pump, a loop filter, a voltage controlled oscillator (VCO), and a divide by N circuit for each channel.

Figure 2:
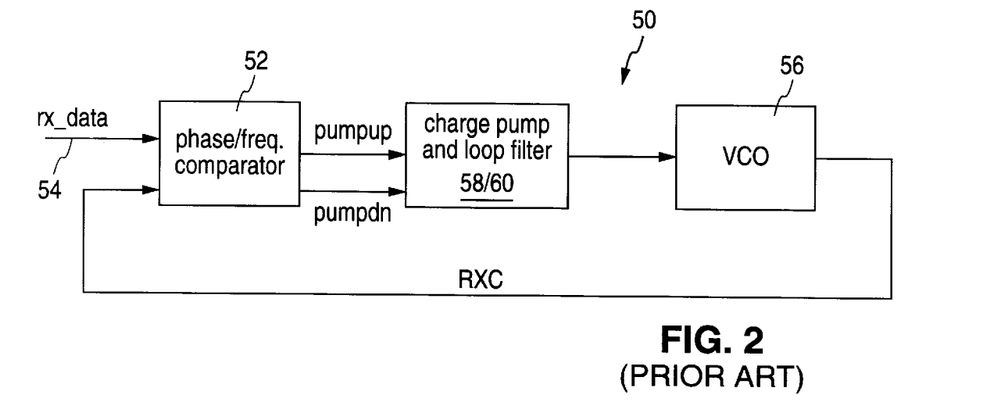
FIG. 2 is a block diagram illustrating the primary functional components of a clock recovery circuit incorporating a VCO based phase-locked loop which may be used for each channel of a dual channel clock recovery circuit.

FIG. 2 shows the primary functional components of a clock recovery circuit 50 incorporating a VCO based phase-locked loop which may be used for each channel of a dual channel clock recovery circuit. The inputs to phase/frequency comparator 52 are the data stream 54, labelled "rx_data" in FIG. 2, and a recovered clock signal labelled "RXC", which represents a control signal output by VCO 56. The recovered clock signal RXC is used to sample the incoming data stream rx_data and is brought into phase alignment with the incoming data stream by the action of the illustrated feedback loop 50. The frequency/phase error between the two inputs to comparator 52 creates a pulse-width modulated pump-up (pumpup) stream and pump-down (pumpdn) stream which are provided as the inputs to charge pump 58. Charge pump 58 charges up when the pumpup pulse is high, and charges down when the pumpdn pulse is high. The output voltage of charge pump 58 is filtered by a loop filter 60, and is typically input to a level translating and slope reversing circuit (not shown) which controls the bias voltage of VCO 56. The output of VCO 56 is provided as an input to a divide-by-N circuit (not shown). The output of the divide-by-N circuit is the RXC input to phase comparator 52.

Figure 3:
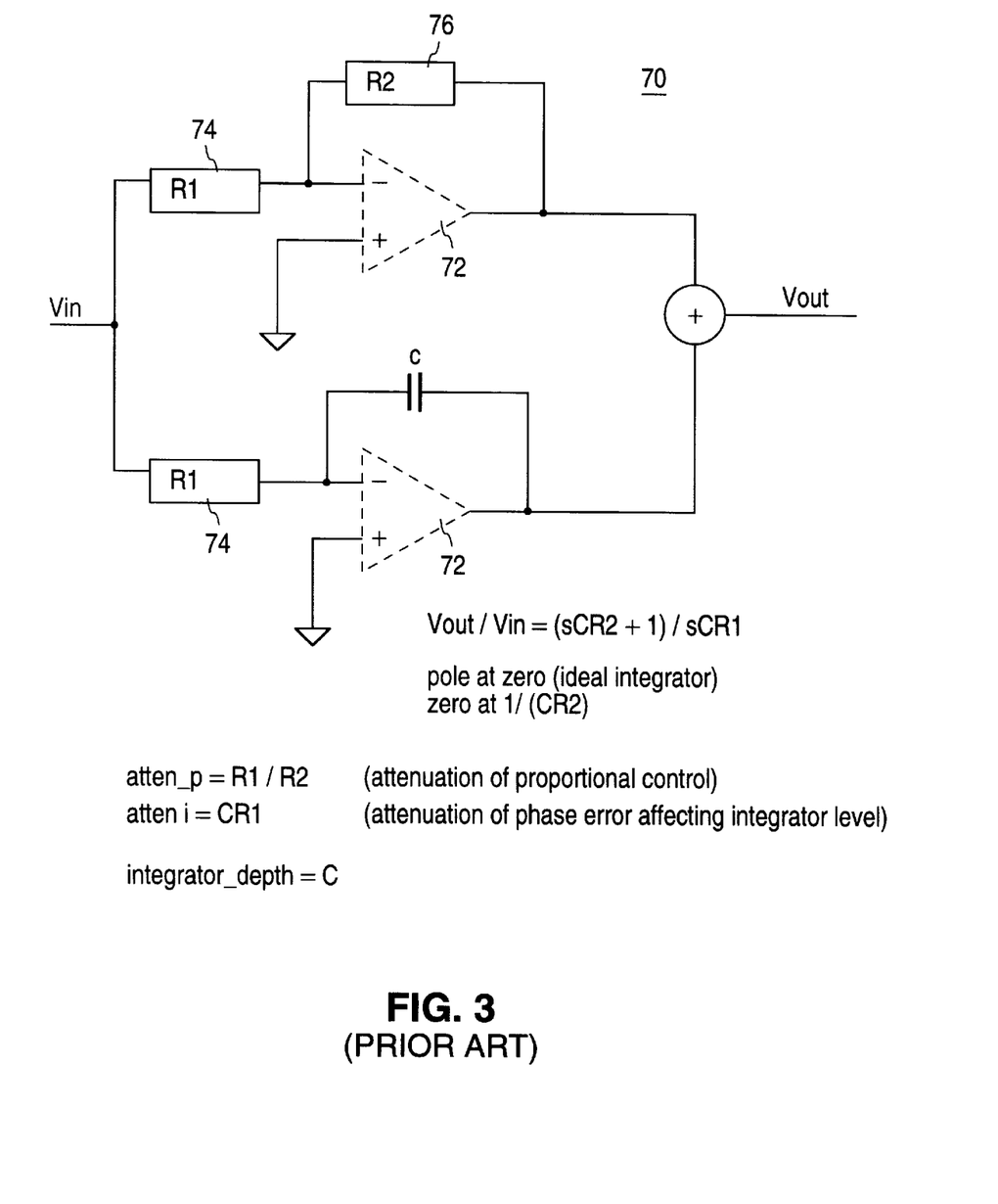
FIG. 3 is a diagram illustrating the analog equivalent of an optimal loop filter suitable for use as the loop filter of the clock recovery circuit of FIG. 2.

FIG. 3 shows the analog equivalent of an optimal loop filter 70 suitable for use as the loop filter 60 of the FIG. 2 clock recovery circuit 50. For a clock recovery circuit that is designed to track a frequency difference while rejecting noise present on the input signal, filter 70 is an optimal filter. This type of filter results in a second order loop transfer function for phase compare, frequency adjust type loops, and a first order loop transfer function for phase compare, phase adjust (phase picker) type loops. Integrator 72 of loop filter 70 provides a high DC gain, which means that the filter can track phase variations that change slowly with time with a small amount of error. With resistor 74 and resistor 76 chosen to give low proportional gain, the filter will not track phase variations that change rapidly with time. Since a small frequency difference between stations corresponds to a slow change in phase, $d\phi/dt$ (where $\phi$ is the phase of the signal), and noise present on the input signal has a fast $d\phi/dt$, filter 70 works well for narrow band (small $\Delta f$) clock recovery.

However, there are several problems encountered when using the circuit illustrated in FIGS. 2 and 3. These include: (1) the gain of the loop 50 depends on process, voltage, and temperature (PVT); (2) the 3-state phase/frequency detector 52 only looks at the rising edge of the input signal and, therefore, it is not possible to lock to the center of a bimodal jitter distribution; (3) the loop filter 60 takes up considerable silicon surface area and does not shrink with feature size; and (4) multiple VCO's on a single substrate can cause injection of one VCO's clock into another VCO.

Another approach to clock recovery is to use a frequency controlled oscillator (FCO), charge pump, and digital loop filter. This approach utilizes a phase detector that can lock to the center of a bimodal jitter distribution, but still uses a charge pump. The digital loop filter creates a pulse density modulated pulse stream to the FCO, where the pulse density modulates the frequency of the FCO. The disadvantages of this approach are: (1) the gain still depends on PVT and (2) the silicon surface area is still large compared to a completely digital approach.

Figure 4:
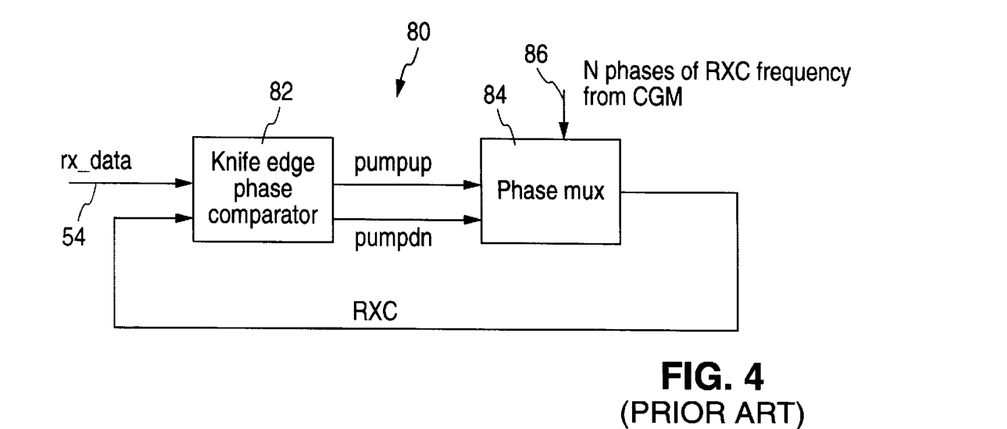
FIG. 4 is a block diagram illustrating the primary functional components of a clock recovery circuit incorporating a phase picker based phase-locked loop which may be used for each channel of a dual channel clock recovery circuit.

Yet another approach to clock recovery is to use a phase picker architecture. FIG. 4 shows the primary functional components of a clock recovery circuit 80 incorporating a phase picker based phase-locked loop which may be used for both channels of a dual channel clock recovery circuit. A phase picker implements a clock recovery loop using a phase comparator 82 to determine the phase error between the comparator inputs, with the output of the phase comparator directly selecting a new phase of the recovered clock signal by using a phase multiplexer 84. The inputs to phase multiplexer 84 are N phases P1-PN of the signal RXC, which are provided by a clock generation module (not shown). The signals output by phase comparator 82 control the operation of phase multiplexer 84 to select one of the N phases P1-Pn.

The inputs to phase comparator 82 are the incoming data stream 54, labelled "rx_data" in FIG. 4, and a signal labelled "RXC 86", which is the clock phase selected by phase multiplexer 84. As before, the RXC signal 86 is used to control the sampling of the data and is brought into phase alignment with the data by the action of the illustrated feedback loop 80.

One limitation of the phase picker architecture is that the amount of attenuation of the proportional control is limited by the phase step resolution of the phase multiplexer. For example, if the resolution is 1 ns, then a leading phase error (RXC leads the input data) would always adjust the phase by retarding RXC by at least 1 ns.

Another limitation of such clock recovery circuits is that the architecture only allows proportional control; there is no means for adding integral control. This is a disadvantage because integral control is desirable to obtain high DC gain and, hence, good tracking behavior.

Finally, another approach to clock recovery is to use a full digital signal processing (DSP) solution. This requires sampling at least at the Nyquist rate, and running the full DSP algorithm at this rate. Therefore, this approach is very power intensive.

What is desired is an apparatus for recovering a clock signal from a transmitted data stream using a single clock recovery channel capable of operating at both 10 mb/sec and 100 mb/sec data rates. This reduces the surface area and power required to extract a clock signal from the data transmitted between two stations or nodes of a local area network.

SUMMARY OF THE INVENTION

The present invention is directed to a clock recovery architecture for recovering a clock signal and serial data from an incoming data stream provided by a node of a local area network. A phase picker architecture augmented by a phase interpolator is used as part of the clock recovery architecture to enhance phase resolution. A single clock generation module (CGM) and N phase multiplexers, one for a clock recovery module (CRM) on a chip, is used to select one of M phases of a 250 Mhz clock signal from the CGM for a clock recovery module (CRM). To provide the required phase resolution, either coupled voltage controlled oscillators or a phase interpolator can be used. The phase interpolator provides better phase resolution with less power and, therefore, is the preferred approach. The phase interpolator is used to create a number of delay steps evenly spaced between the gross phase steps of the phase multiplexer. Each phase multiplexer is advanced or retarded in response to the pump-up (pumpup) or pump-down (pumpdn) signals from each clock recovery channel (CRM).

The phase interpolator and phase multiplexer for each receive channel are shared by a digital 100 mb CRM and a digital 10 mb CRM. When a port is in 10 mb mode, the 10 mb CRM provides the pumpup and pumpdn pulses to the phase interpolator and the 100 mb CRM is powered down. When a port is in 100 mb mode, the 100 mb CRM provides the pumpup and pumpdn pulses to the phase interpolator and the 10 mb CRM is powered down.

The phase picker architecture of the present invention differs from prior art phase pickers because it includes a digital implementation of an optimal loop filter. This implementation is not a digital signal processing based technique and, hence, does not require sampling at the Nyquist rate. The integral control filter used as part of the invention is simple and allows tracking station clocks during periods of low data transition density. As noted, a phase interpolator (used instead of coupled VCO's to give the required phase resolution) is used to break a given phase step into a number (in this case eight) of equal phase steps. The fully digital architecture of the present invention provides performance independent of PVT. Power is low (8 mW/CRM) and the surface area utilized is small (100 sq mils) for a 0.35 um, 3.3V process.

The single CGM, multiple CRM architecture of the present invention gives the lowest power and area for multiport applications. The single CGM can be used to provide six clock phases for multiple 10 BT and 100 BT CRM's. Most of the clock recovery loop runs at the incoming data rate, which is an average of 30 Mhz for 100 BT. This results in much lower power consumption than prior art circuits.

Further objects and advantages of the present invention will become apparent from the following detailed description and accompanying drawings which set forth an illustrative embodiment in which the principles of the invention are utilized.

DETAILED DESCRIPTION OF THE INVENTION

The clock generation module/clock recovery module (CGM/CRM) architecture of the present invention is motivated by the need for a low surface area and power consumption solution for a 100 mb physical layer of a local area network. This solution is designed to allow the integration of a number of physical layer ports into repeaters and switches. The inventive architecture makes use of a phase interpolator. This allows the generation of arbitrarily small delays between phases in the coupled VCO, permitting the use of a digital phase picker clock recovery architecture for the recovery of 100 mb, or even 1000 mb data. The CGM and CRM can be used for clock recovery for both 100 mb and 10 mb data rates. This saves significant power and reduces the required surface area. Among other things, this allows integration of PHY cells into an ASIC (application specific integrated circuit). The use of a phase interpolator allows construction of a CRM with power consumption and area requirements an order of magnitude smaller than current architectures.

The inventive architecture satisfies the following requirements: (1) power low enough to enable building a quad 10/100 phy/xvr with no heat spreader; (2) area/power optimized as much as possible to allow integration of phy ports into repeaters and switches; (3) 3 volt operation; (4) a primarily digital design to allow easy porting to new processes; and (5) compliance with the TP-PMD jitter specification.

Figure 5:
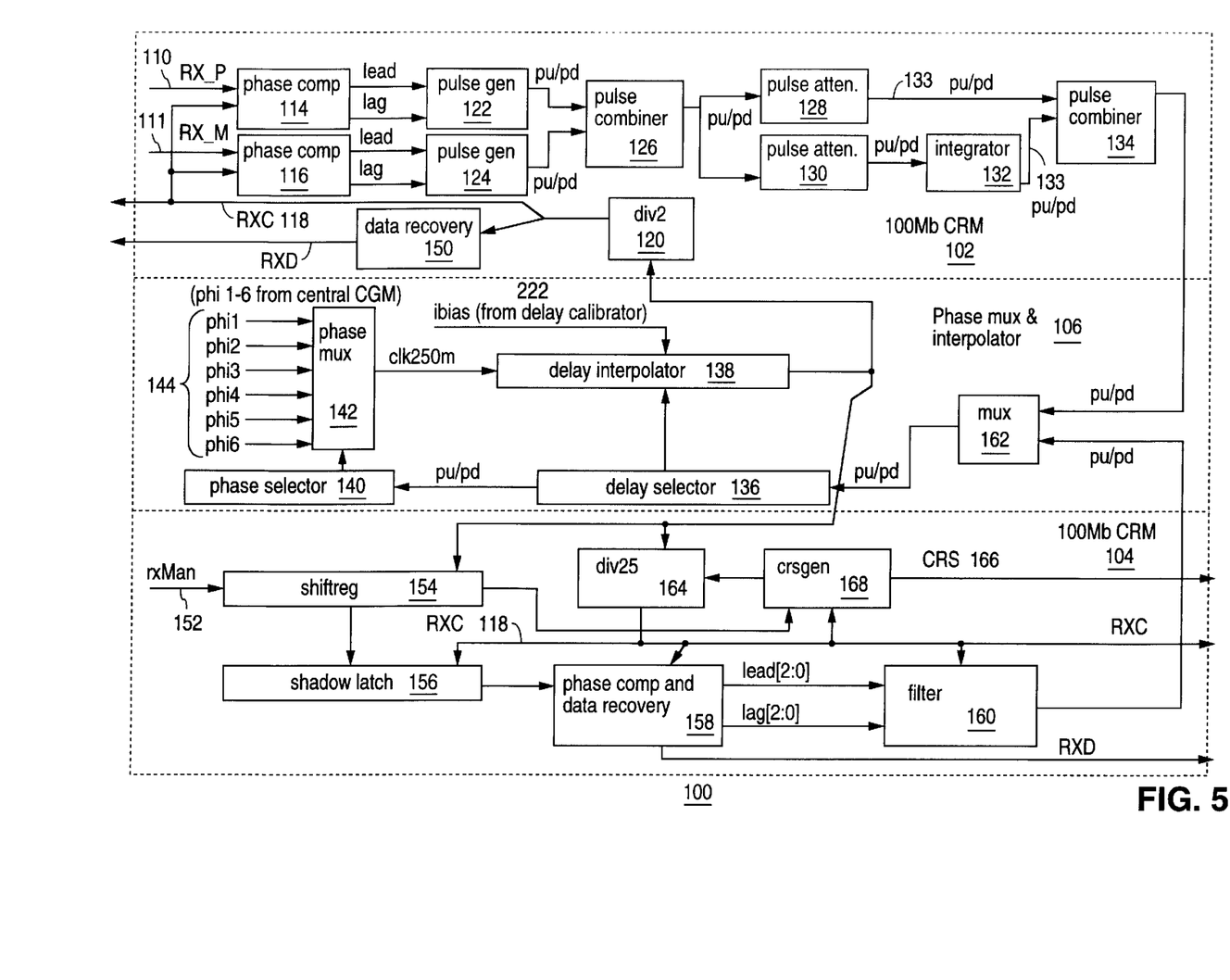
FIG. 5 is a detailed block diagram illustrating a clock recovery circuit in accordance with the present invention.

Referring to FIG. 5, the present invention utilizes a phase picker clock recovery architecture that adjusts the phase of the recovered clock, labelled "RXC" in FIG. 5, in response to a filtered phase error detected by the phase detector. The phase detector (or phase comparator) compares the phase of the recovered clock with the incoming data, labelled "RX_P or RX_M" in FIG. 5. The clock signal phase is adjusted by selecting a different phase of N available phases that are provided by a clock generation module using an N:1 phase multiplexer and a secondary mux that provides further phase resolution using the delay interpolatorr. For purposes of comparison, note that a phase picker clock recovery loop of a given order has essentially the same response as a VCO based clock recovery loop of that order plus one.

As noted, the present invention is a phase picker architecture augmented by a delay interpolator which is used to enhance phase resolution. A single CGM and N phase multiplexers, one for each clock recovery channel on the chip, are used to allow selecting one of M phases of a 250 Mhz clock from the CGM for each clock recovery channel. To provide the required phase resolution, the delay interpolator is used to create a number of delay steps evenly spaced between the gross phase steps of the phase multiplexer. This enhancement is required to meet the 100 mb ethernet jitter specification. Each clock recovery channel consists of a single 10 mb CRM and a single 100 mb CRM. Each CRM is completely digital and uses an architecture that minimizes power and gate count.

The phase multiplexer and phase interpolator 106 for each receive channel are shared by a digital 100 mb CRM and a digital 10 mb CRM. When a port is in the 10 mb mode, the 10 mb CRM provides the pumpup and pumpdn pulses to the delay interpolator and the 100 mb CRM is powered down. When a port is in the 100 mb mode, the 100 mb CRM provides the pumpup and pumpdn pulses to the delay interpolator and the 10 mb CRM. is powered down.

FIG. 5 is a detailed block diagram illustrating an embodiment of a clock recovery circuitry 100 in accordance with the concepts of the present invention. As discussed in greater detail below, the FIG. 5 embodiment of the invention includes three primary functional modules: a 100Mb data rate clock recovery module 102, a 10Mb data rate clock recovery module 104, and a shared phase multiplexer and phase interpolator module 106. 100Mb data rate module 102 may be further subdivided into the functional units of a phase comparator block, a loop filter block and a data recovery block.

The 100 Mb Clock Recovery Module (CRM)

With continuing reference to FIG. 5, single ended data input RX_P 110 is asserted high by an MLT3 decoder (not shown) when NRZ data is a one. Single ended input RX_M 111 is asserted high by the MLT3 decoder when NRZ data is a zero. Phase comparators 114 and 116 each consist of a special flip-flop with a symmetric setup/hold window of +/−50 ps. The data input RX_P 110 for rising edge phase comparator 114 and RX_M 111 for falling edge phase comparator 116 clocks the flop. The data input to the flops in phase comparators 114 and 116 is RXC 118-1, the output of clock divider 120. If RXC 118-1, is leading the data, a one is output at the rising edge of the data. If RXC 118-1 is lagging data, a zero is output at the rising edge of the data. This arrangement produces a knife edge type of phase comparator which quantizes the phase error into a single bit binary value. This is sufficient because the DCD portion of the jitter budget is a small part (22%) of the entire jitter budget. It can be shown that this type of phase comparator will lock to the center of the bimodal distribution, as long as there are components of RJ and DDJ along with DCD. Therefore, the 22% of DCD jitter is not a problem. Phase comparators 114 and 116 assert signal lead when RXC 118-1 is leading data and assert signal lag when RXC 118-1 is lagging data. This acts to bring the clock signal into phase with the data.

The lead and lag signals output by the phase comparators 114 and 116 are input to pulse generators 122 and 124, respectively, each of which generates a pump up (pumpup) pulse synced to RXC 118-1 at every edge of data where RXC is lagging the data and a pump down (pumpdn) pulse synced to RXC 118-1 at every edge of data where RXC is leading the data. The pulse streams produced by pulse generators 122 and 124 are conditioned and used to control the operation of the phase multiplexor and phase interpolator which determines the amount of delay or phase difference applied to the data stream to bring it into synchronization with the clock signal.

The pumpup and pumpdn pulse trains from leading edge and lagging edge pulse generators 122 and 124 are input to pulse combiner 126, which performs a logical OR operation on the pumpup and pumpdn streams. This creates a single, combined pumpup stream and pumpdn stream. Even though a single stream is ultimately used, the purpose of separate rising and falling edge phase comparators and pulse generators is twofold: (1) it helps locking to the center of bimodal jitter distributions and (2) it provides phase error information twice as often as would a single phase comparator looking at only one edge of the signal.

Proportional control for phase error correction is provided by passing the pumpup and pumpdn stream through a pulse stream attenuator 128, which masks out every N pulses from the pulse stream, where N is equal to p_atten, the desired amount of proportional control attenuation. This parameter can be programmed into a device register.

Integral control for phase error correction is provided by passing the pumpup and pumpdn pulse stream from pulse combiner 126 into pulse stream attenuator 130, which masks out every N pulses, where N is equal to i_atten, the desired amount of attenuation to the input of the integrator. This parameter can also be programmed through a device register.

The output of pulse stream attenuator 130 is provided to integrator 132. Integrator 132 is an up/down counter that increments on a pumpup pulse and decrements on a pumpdn pulse if the direction flop is set. Otherwise, it decrements on a pumpup pulse and increments on a pumpdn pulse. Since the pumpup and pumpdn pulse density are proportional to the phase error, the count value will be proportional to the past history of the phase error between the transmit and receive station signals. If the counter is above zero and the direction flop is set, then a pumpup pulse is generated every N RXC's-1, where N is inversely proportional to the count. If the counter is above zero and the direction flop is zero, then a pumpdn pulse is generated every N RXC's-1, again where N is inversely proportional to the count. In the absence of pumpup pulses and pumpdn pulses from the proportional counters, which may happen with an extended series of zeros or ones in the incoming data stream, the pumpup/dn signals 133-2 from integrator 132 will continue to compensate for the ppm difference between the frequency of the transmitting and receiving stations. The direction flop gets set when a pumpup pulse occurs and the count is zero, and gets reset when a pumpdn pulse occurs and the count is zero.

The depth of integrator 132, i.e. the number of bits in the up/down and RX counter, determines the limits and granularity of the integral control. The minimum amount of integral control occurs when the up/down counter is zero and either a pumpup or pumpdn output pulse is generated from integrator 132 every N clocks, where $N=2^M$ and M is the integrator depth. The integrator depth also affects lock time, since a deeper integrator will take longer to lock. The actual lock time is a function of both the integrator depth and the attenuation of proportional control.

The digital filter contained in the 100 Mb data rate clock recovery module 102 implements the same control in the feedback loop as the optimal analog filter shown in FIG. 3. In addition, it performs the loop filter function in a manner that is more power and area efficient than standard digital signal processing solutions. For example, Table I below shows the filter components and their operating frequencies.

TABLE I

| Block | Operating Frequency |
|---|---|
| pulse generators | 125 Mhz |
| pulse attenuators | 30 Mhz (average) |
| integrator RXC counter | 125 Mhz |
| integrator up/dn counter | 30 Mhz (average) |

For comparison, a DSP solution would require sampling the data at a rate of 125 Mhz and running the DSP algorithm at the same rate. Since DSP methods require a number of multiplications, the gate count of such an implementation would be much higher, with a corresponding increase in power consumption and die surface area.

The pumpup and pumpdn pulse streams 133-2 and 133-1 from integrator 132 and pulse attenuator 128, respectively, are combined in pulse stream combiner 134 to provide a pumpup and pumpdn stream having a pulse density proportional to the phase error, attenuated by proportional gain and by the past history of the phase error.

The pumpup and pumpdn pulse stream is used to modify the 6 bit control word output of delay selector 136 in the following manner. The 6 bit control word will always contain exactly one bit set to "1", with all other bits set to zero. Every pumpup pulse causes the control word to shift the "1" one position to the right. For example, if the delay selector 136 contains 010000, 2 pumpup pulses will result in a value of 000100; from here, 3 pumpdn pulses will result in a value of 100000.

The value of the delay selector 136 is used to select one of 6 delayed versions as the output of phase multiplexer 142, each of the delays differing by 55 ps. The following table shows the control word and associated delays and control currents from a phase interpolator calibration block (described in greater detail below).

| control word | current used for selected var delay | delay |
|---|---|---|
| 6'h100000 | IdlyX5[n] | const delay + 275 ps |
| 6'h010000 | IdlyX4[n] | const delay + 220 ps |
| 6'h001000 | IdlyX3[n] | const delay + 165 ps |
| 6'h000100 | IdlyX2[n] | const delay + 110 ps |
| 6'h000010 | IdlyX1[n] | const delay + 055 ps |
| 6'h000001 | IdlyX0[n] | const delay + 000 ps |

When the delay selector 136 contains 000001, and a pumpup pulse is received, the delay selector 136 shifts to 100000, and a pumpup pulse is sent to phase selector shift register 140. This causes the phase multiplexer 142 to select a phase that is advanced 333 ps from the current phase. For example, if the current phase is phi4, then the phase mux 142 would select phi3. Since the delay selector 136 shifts to 100000 at same time that the phase mux 142 advances phase by 333 ps, the net result is advancing the phase by 55 ps, the same as if the delay selector 136 received a pumpup pulse when the value of delay selector 136 was 010000 (or some value other than 000001), causing the delay selector 136 to move to 001000. When the delay selector 136 contains 100000, and a pumpdn pulse is received, the delay selector 136 shifts to 000001, and a pumpdn pulse is sent to phase selector 140. This cause the phase mux 142 to select a phase that is retarded 333 ps from the current phase. For example, if the current phase is phi3, then the phase mux 142 would select phi4. Since the delay selector 136 shifts to 000001 at same time that the phase mux 142 retards phase by 333 ps, the net result is retarding the phase by 55 ps, the same as if the delay selector 136 received a pumpdn pulse when the value of delay selector 136 was 0010000 (or some value other than 100000), causing the delay selector 136 to move to 010000.

The phase selector 140 is a bidirectional shift register with a 1 bit always set; the non-inverted output of that bit (Q) and the inverted output of the bit (QZ) are used to turn on one of the transfer gates in the phase mux 142. The delay selector 136 is also a bidirectional shift register with 1 bit always set; the non-inverted output of that bit (Q) and the inverted output of that bit (QZ) are used to turn on one of the transfer gates in the multiplexer in the delay interpolator 138. The mux in delay interpolator 138 can be thought of as a fine tuning phase shifter, while the phase mux 142 can be thought of as a coarse tuning phase shifter.

The following table provides examples showing values of coarse and fine phase tuners while continuously advancing phase in response to pumpup signals:

| delay selector | phase selector | coarse phase adjust from last phase | fine phase adjust from last phase | total adj from last |
|---|---|---|---|---|
| 6'b001000 | 12'b00001000000 | N/A | N/A | N/A |
| 6'b000100 | 12'b00001000000 | 0 | −55 ps | −55 ps |
| 6'b000010 | 12'b00001000000 | 0 | −55 ps | −55 ps |
| 6'b000001 | 12'b00001000000 | 0 | −55 ps | −55 ps |
| 6'b100000 | 12'b00000100000 | −333 ps | +275 ps | −55 ps |
| 6'b010000 | 12'b00000100000 | 0 | −55 ps | −55 ps |

A description of an embodiment of a phase multiplexer and interpolator block 106 suitable for use in conjunction with the present invention may be found in the U.S. Pat. No. 6,121,808 to Gaudet which is hereby incorporated by reference in its entirety.

The 10 Mb Clock Recovery Module (CRM)

With continuing reference to FIG. 5, signal RxMan (Manchester encoded data) 152, which is output from a 10 Base-T (10 BT) squelch comparator (not shown), is sampled by the 250 Mhz clock signal, having the selected phase which is output by delay interpolator 138, in a twenty stage shift register 154. At the rising edge of RXC 118-2, which is the 10 Mhz recovered clock, the contents of the shift register 154 are loaded into a shadow latch 156. Shadow latch 156 allows holding of the sampled contents of the shift register 154 for 100 ns, until the next edge of RXC 118-2. During this time, the contents of shadow latch 156 are looked at by phase compare and data recovery block 158. Depending upon the received data and the amount of jitter, up to three transitions may be captured in shadow latch 156. Phase compare and data recovery block 158 chooses the transition closest to the center of the 20 stage shadow latch 156 as the true mid-bit transition, using, for example, the following algorithm:

pc_latched is the shadow latch.
assign lead9x=pc_latched[0]^pc_latched[1];
assign lead8x=pc_latched[1]^pc_latched[2];
assign lead7x=pc_latched[2]^pc_latched[3];
assign lead6x=pc_latched[3]^pc_latched[4];
assign lead5x=pc_latched[4]^pc_latched[5];
assign lead4x=pc_latched[5]^pc_latched[6];
assign lead3x=pc_latched[6]^pc_latched[7];
assign lead2x=pc_latched[7]^pc_latched[8];
assign lead1x=pc_latched[8]^pc_latched[9];
assign onx=pc_latched[9]^pc_latched[10];
assign lag1x=pc_latched[10]^pc_latched[11];
assign lag2x=pc_latched[11]^pc_latched[12];
assign lag3x=pc_latched[12]^pc_latched[13];
assign lag4x=pc_latched[13]^pc_latched[14];
assign lag5x=pc_latched[14]^pc_latched[15];
assign lag6x=pc_latched[15]^pc_latched[16];
assign lag7x=pc_latched[16]^pc_latched[17];
assign lag8x=pc_latched[17]^pc_latched[18];
assign lag9x=pc_latched[18]^pc_latched[19];

At the conclusion of this algorithm, register "pe" (phase error) will contain the location of the true mid-bit transition with respect to RXC 118-2 (with no jitter and PLL in lock, onx should be the only transition). Its value is determined by, for example, the following algorithm:

```
reg [18:0] pe;
always@(lag1x or lag2x or lag3x or lag4x or
lag5x or lag6x or lag7x or
    lag8x or lag9x or lead1x or lead2x or
lead3x or lead4x or lead5x or
    lead6x or lead7x or lead8x or lead9x or
onx)
    if (onx)
        pe <= #10 19'b0000000001000000000;
    else if(lead1x)
        pe <= #10 19'b0000000000100000000;
    else if(lag1x)
        pe <= #10 19'b0000000010000000000;
    else if(lead2x)
        pe <= #10 19'b0000000000010000000;
    else if(lag2x)
        pe <= #10 19'b0000000100000000000;
    else if(lead3x)
        pe <= #10 19'b0000000000001000000;
    else if(lag3x)
        pe <= #10 19'b0000001000000000000;
    else if(lead4x)
        pe <= #10 19'b0000000000000100000;
    else if(lag4x)
        pe <= #10 19'b0000010000000000000;
    else if(lead5x)
        pe <= #10 19'b0000000000000010000;
    else if(lag5x)
        pe <= #10 19'b0000100000000000000;
    else if(lead6x)
        pe <= #10 19'b0000000000000001000;
    else if(lag6x)
        pe <= #10 19'b0001000000000000000;
    else if(lead7x)
        pe <= #10 19'b0000000000000000100;
    else if(lag7x)
        pe <= #10 19'b0010000000000000000;
    else if(lead8x)
        pe <= #10 19'b0000000000000000010;
    else if(lag8x)
        pe <= #10 19'b0100000000000000000;
    else if(lead9x)
        pe <= #10 19'b0000000000000000001;
    else if(lag9x)
        pe <= #10 19'b1000000000000000000;
    else
        pe <= #10 19'b0000000001000000000;
```

The recovered data is the value of the shadow latch 156 to the right of the true mid-bit transition:

```
assign rxd_tmp = | (phasecomp[18:0] & pe);
//***************
// convert the magnitude of the leading
phase_error to a 3 bit number
//
reg [2:0] lead_error;
always@(pe)
    case ({pe[0] | pe[1] | pe[2] | pe[3] |
```

-continued

```
       pe[4], pe[5],pe[6],pe[7],pe[8]})
    //synopsys full_case parallel_case
           5'b00000 : lead_error <= #10 3'b000;
           5'b00001 : lead_error <= #10 3'b001;
           5'b00010 : lead_error <= #10 3'b010;
           5'b00100 : lead_error <= #10 3'b011;
           5'b01000 : lead_error <= #10 3'b100;
           5'b10000 : lead_error <= #10 3'b101;
       endcase
//************************
// convert the magnitude of the lagging
phase_error to a 3 bit number
//
reg [2:0] lag_error;
always@(pe)
       case ({|pe[18:14],pe[13:10]})
    //synopsys full_case parallel_case
           5'b00000 : lag_error <= #10 3'b000;
           5'b00001 : lag_error <= #10 3'b001;
           5'b00010 : lag_error <= #10 3'b010;
           5'b00100 : lag_error <= #10 3'b011;
           5'b01000 : lag_error <= #10 3'b100;
           5'b10000 : lag_error <= #10 3'b101;
       endcase
```

Using the above algorithms, or their equivalents, both the magnitude of the phase error and the recovered data is determined by the next rising edge of RXC 118-2.

The lead_error[2:0] and lag_error[2:0] vectors output from phase compare and data recovery block 158 are input to digital filter 160. Digital filter 160 uses a lead counter to continuously add the lead_error vectors to a sum at every edge of RXC 118-2 until a programmable threshold is reached, upon which the counter is reset, and a pumpdn pulse is output. A lag counter is used to continuously add the lag_error vectors to a sum at every edge of RXC 118-2 until a programmable threshold is reached, upon which the counter is reset, and a pumpup pulse is output. The threshold is used to determine the amount of proportional attenuation used for the loop. Integral control is not required due to the high transition density of Manchester data.

Because the 10 Mb and 100 Mb CRMs share the same phase multiplexer and phase interpolator, there is a potential problem that occurs because of the fine phase adjust resolution required for 100 Mb. The problem is that, even with the minimum threshold programmed, the gain is not high enough to allow tracking a 200 ppm frequency delta between end stations. The small phase adjust has the effect of allowing only a small dφ/dt (with φ being the phase), which limits the frequency range that can be tracked (because frequency is the rate of change of phase). This problem is rectified by creating eight pump pulses synced to a 125 Mhz clock for every one pump pulse (synced to 10 Mhz clock) output from the filter. This boosts the gain enough to allow tracking the clock from the far end station. The fast pumpup/pumpdn pulse stream is sent to multiplexer 162 which, when in the 10 Mb mode, allows these pulses to effect the operation of phase multiplexer 142 and delay interpolator 138.

Divide-by-25 (div25) block 164 takes the 250 Mhz clock output of delay interpolator 138 and divides this down to 10 Mhz, creating RXC 118-2. It also divides it down by 2 to create the 125 Mhz clock used to increase the loop gain. RXC 118-2 is used to clock the shadow latch 156 and filter 160. Divide-by-25 counter 164 is reset at the rising edge of CRS 166, which is provided by crsgen module 168. This provides a fast phase adjustment, locking RXC 118-2 to within 4 ns of the first mid-bit transition detected during preamble. This gives a very fast lock time, which is useful for certain applications.

Crsgen block 168 contains a counter that is reset every time a transition is detected in bits 9 and 10 of the output of shift register 154. If the counter times out, a timeout pulse is sent to a simple state machine that sets CRS 166 whenever a transition is detected, and resets CRS 166 whenever the timeout signal is asserted. This enables the generation of an indication of a carrier that frames the recovered data RXD in such a way that no dribble bits are generated.

Note that since the magnitude of the phase error is added to the filter counters, and the pumpup/pumpdn pulse density is proportional to the phase error, the loop ends up quantizing the phase error to a resolution of 4ns, the sampling resolution in shift register 154. This allows locking to the center of a bimodal jitter distribution of up to 40 ns p-p, which is enough to meet the IEEE 802.3 specification of 36 ns p-p. The effective 667 ps phase adjust resolution gives a theoretical tolerance to a gaussian jitter distribution of 48.6 ns. Also note that, during extended sequence of 010101 data, the jitter tolerance doubles, since the phase comparator looks at an 80 ns slice of samples, and can pick the most likely mid-bit transition.

Figure 6:
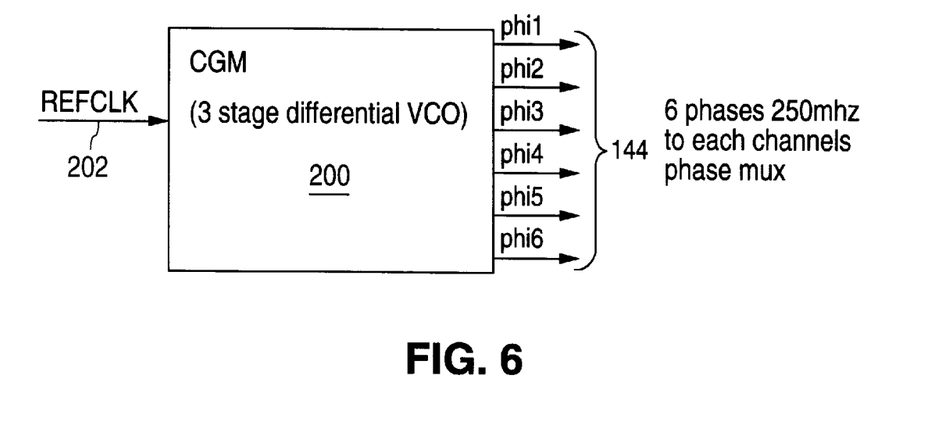
FIG. 6 is a block diagram illustrating a central clock generation module (CGM) used to provide the phases of the 250 Mhz signal to the phase multiplexer of the FIG. 5 circuit.

FIG. 6 is a block diagram showing the central clock generation module (CGM) 200 used to provide the phases of the 250 Mhz clock signal 144 to phase multiplexer 142 of the FIG. 5 circuit. CGM 200 is implemented in the form of a three stage differential voltage controlled oscillator having a signal REFCLK 202 (reference clock) as an input.

Figure 7:
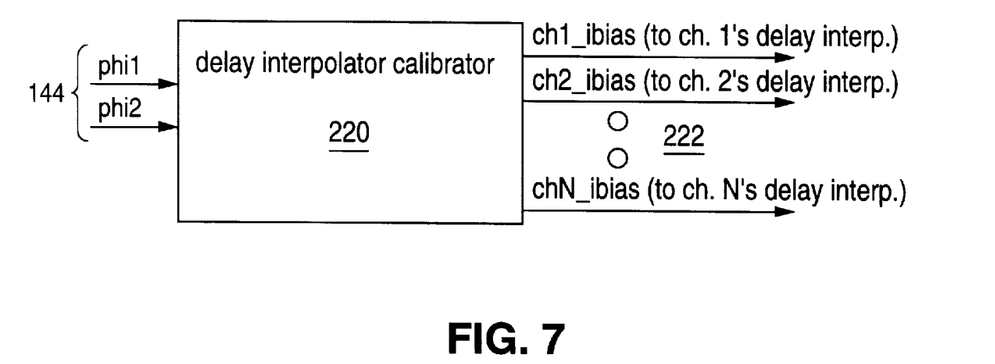
FIG. 7 is a block diagram illustrating the delay interpolator calibrator used to provide the bias signals to the delay interpolator of the FIG. 5 circuit.

FIG. 7 is a block diagram showing the delay interpolator calibrator 220 used to provide the bias signals to delay interpolator 138 of the FIG. 5 circuit. As shown in FIG. 7, the inputs to delay interpolator calibrator 220 are signals phi1 and phi2, two of the six different phase clock signals 144 produced by CGM 200. The outputs of delay interpolator calibrator 220 are N bias currents 222, where one of the N bias currents are provided as an input to each of N delay interpolators, with one such interpolator used for each of the N channels.

The clock recovery approach of the present invention differs from prior art solutions in the method of determining phase error and recovering the data. Prior art solutions typically sample the Manchester data stream 25 ns following the rising edge of RXC to recover data. Prior art solutions would provide a masking signal 50 ns in duration and delayed 25 ns from the rising edge of RXC to mask out non mid-bit transitions, using the non-masked transitions to determine the phase error.

The approach of the present invention is based upon choosing the most likely mid-bit transition through a logic efficient algorithm that finds the transition closest to the rising edge of RXC. Once this is found, data is recovered by taking the sample to the right of the mid-bit transition as the recovered data (labelled "RXD" in the figures). The phase error is calculated between the most likely mid-bit transition and the rising edge of RXC. This provides much better performance in the case of extreme bimodal jitter distributions, where the mask may start to mask out actual mid-bit transitions, or not mask out non mid-bit transitions. Data recovery is robust, because even when RXC varies from the perfect lock, the algorithm can still decode data with extreme jitter. Another advantage of the present invention is that jitter tolerance doubles during alternating zeros and ones, since there are no non mid-bit transitions, and this approach does not attempt to mask them.

The present invention is directed to a fully digital architecture which provides performance independent of PVT. The power requirement is low (8 mW/CRM) and the area is small (100 sq mils) for a .35 um, 3.3V process. For comparison, prior art approaches have a typical power requirement of 60mW, and require about 1000 sq mils of area using the same process.

An important feature of the invention is that the single CGM, multiple CRM architecture gives the lowest power consumption and surface area for multiport applications. The single CGM (which is very large compared to a CRM) can be used to provide 6 clock phases for multiple 10 BT and 100 BT CRMs. Each phase multiplexer/interpolator is shared between a 10 mb CRM. and a 100 mb CRM. This makes it easier to keep the phase multiplexers/interpolators close to the CGM, and minimizes routing to the phase multiplexers. This in turn makes it easier to match skew between phases going to each phase multiplexer.

Most of the elements of the clock recovery loop of the present invention run at the incoming data rate, which is an average of 30 Mhz for 100 BT. This results in much lower power consumption than prior art circuits. The integral control filter architecture is simple and allows tracking far end station clock during periods of low transition density. A phase interpolator allows breaking a given phase step into 8 equal phase steps. This enhances the phase resolution of the circuitry.

The digital filter architecture is simple (not many gates) and gives great flexibility to the loop dynamics by allowing on the fly changing of the attenuation of proportional to integral control. One advantage of this is it allows optimizing the loop gain for fast lock, and then changing for optimal jitter rejection during tracking.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

What is claimed is:

1. A clock recovery circuit comprising
   a first phase comparator that detects a phase difference between a reference clock signal and a first input data signal, wherein the first phase comparator outputs a first lead pulse when the reference clock signal leads the first input data signal and outputs a first lag pulse when the reference clock signal lags the first input data signal;
   a second phase comparator that detects a phase difference between the reference clock signal and a second input data signal, wherein the second phase comparator outputs a second lead pulse when the reference clock signal leads the second input data signal and outputs a second lag pulse when the reference clock signal lags the second input data signal;
   a first pulse generator that responds to first lead pulses and to first lag pulses by providing a first pumpup/pumpdown output signal that includes pumpup pulses that correspond to each first lead pulse and pumpdown pulses that correspond to each first lag pulse;
   a second pulse generator that responds to second lead pulses and to second lag pulses by providing a second pumpup/pumpdown output signal that includes pumpup pulses that correspond to each second lead pulse and pumpdown pulses that correspond to each second lag pulse;
   a first pulse combiner that logically ORs the first pumpup/pumpdown output signal and the second pumpup/pumpdown output signal to provide a combined pumpup/pumpdown output signal;
   a first pulse stream attenuator that masks out every N pulses from the combined pumpup/pumpdown output signal to provide a proportional control attenuator pulse signal, where N is an integer that provides a predefined amount of proportional control;
   a second pulse stream attenuator that masks out every M pulses from the combined pumpup/pumpdown output signal to provide an integral control attenuator pulse signal, where M is an integer that provides a predefined amount of integral control;
   an integrator that integrates the integral control attenuation pulse signal to provide an integrated up/down pulse signal; and
   a second pulse combiner that combines the proportional control attenuation pulse signal and the integrated up/down pulse signal to provide an up/down output pulse stream having a pulse density proportional to the phase error and attenuated by proportional gain and by past history of the phase error.

2. The clock recovery circuit of claim 1, and wherein the integrator comprises an up/down counter.

3. The clock recovery circuit of claim 1, and further comprising:
   a delay selector that outputs delay information in response to the up/down output pulse stream;
   a clock source that generates a plurality of phase-separated base clock signals and provides a selected one of the phase-separated base clock signals as an output base clock signal based upon the delay information; and
   a delay interpolator that delays the output base clock signal an amount based upon the delay information, the delayed output base clock signal corresponding to the reference clock signal.

4. The clock recovery circuit of claim 3, and wherein the delay information comprises an n-bit word capable of having a plurality of values, including a first value and a second value, the n-bit word changing its value in response to the up/down output pulse stream.

5. The clock recovery circuit of claim 4, and wherein the delay selector changes the delay information in response to the plurality of values.

6. The clock recovery circuit of claim 5, and wherein the clock source changes the selected one of the phase-separated base clock signals when the n-bit word changes from the first value to the second value, and when the n-bit word changes from the second value to the first value.

7. The clock recovery circuit of claim 5, and further comprising a divide-by-M circuit that divides down the delayed output base clock signal to provide the reference clock signal.

8. The clock recovery circuit of claim 4, and wherein the n-bit word includes a single logic one and a plurality of logic zeros, and wherein the single logic one is shifted in a first direction in response to each up pulse in the up/down output pulse stream, and wherein the single logic one is shifted in a second direction in response to each down pulse in the up/down output pulse stream.

9. The clock recovery circuit of claim 3 and further comprising:
   a divide-by-S circuit that divides down the delayed output base clock signal to output a divided clock signal;
   a third phase comparator connected to the delay block and the divide-by-S circuit that captures a third data signal with the delayed output base clock signal and the divided clock signal to form captured data, and determines mid-bit transition information from the captured data to output lead error information and lag error information;

a second filter connected to the divide-by-S circuit and the third phase comparator that filters the lead error information to output a second filtered up pulse stream, the second filtered up pulse stream having a pulse density proportional to a phase error between the delayed clock signal and the third data signal, and filters the lag error information to output a second filtered down pulse stream, the second filtered down pulse stream having a pulse density proportional to a phase error between the delayed clock signal and the third data signal; and a multiplexer that passes the first filtered up pulse signal and the first filtered down pulse signal when data that defines the first and second data signals are to be recovered, and that passes the second filtered up pulse signal and the second filtered down pulse signal when data that defines the third data signal are to be recovered, the delay selector outputting delay information in response to the first filtered up pulse stream and the first filtered down pulse stream when data that defines the first and second data signals are to be recovered, and outputting delay information in response to the second filtered up pulse stream and the second filtered down pulse stream when data that defines the third data signal are to be recovered.

10. The clock recovery circuit of claim 9, and wherein the third phase comparator comprises:

a shift register that receives the third data signal, shifts data through the register in response to edges of the delayed clock signal, and outputs parallel data held in the shift register in response to edges of the divided clock signal;

a latch connected to the shift register that holds the parallel data; and a phase comparer connected to the latch that determines mid-bit transition information from the parallel data to output the lead error information and the lag error information.

11. The clock recovery circuit of claim 10, and wherein the divide-by-S circuit includes a reset circuit, the reset circuit outputting a reset signal that resets the divide-by-S circuit, the reset signal being output when a transition is detected after a predefined transition has not been detected for a predetermined period of time.

* * * * *